United States Patent
Kimura et al.

(10) Patent No.: US 9,070,844 B2
(45) Date of Patent: Jun. 30, 2015

(54) SEMICONDUCTOR LIGHT EMITTING ELEMENT AND METHOD FOR MANUFACTURING SAME

(71) Applicant: KABUSHIKI KAISHA TOSHIBA, Minato-ku (JP)

(72) Inventors: Akiya Kimura, Kanagawa-ken (JP); Kazuhito Higuchi, Kanagawa-ken (JP); Susumu Obata, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/026,178

(22) Filed: Sep. 13, 2013

(65) Prior Publication Data

US 2014/0252388 A1  Sep. 11, 2014

(30) Foreign Application Priority Data

Mar. 6, 2013  (JP) ................................. 2013-044547

(51) Int. Cl.
*H01L 33/00* (2010.01)
*H01L 33/50* (2010.01)

(52) U.S. Cl.
CPC .......... *H01L 33/502* (2013.01); *H01L 33/0079* (2013.01); *H01L 33/501* (2013.01); *H01L 33/504* (2013.01); *H01L 2933/0041* (2013.01)

(58) Field of Classification Search
CPC ... H01L 33/501; H01L 33/502; H01L 33/504; H01L 33/0079; H01L 2933/0041
See application file for complete search history.

(56) References Cited

U.S. PATENT DOCUMENTS

| 8,581,291 B2 | 11/2013 | Shimokawa et al. |
| 8,614,455 B2 | 12/2013 | Obata et al. |
| 2008/0231170 A1* | 9/2008 | Masato et al. ................ 313/501 |

(Continued)

FOREIGN PATENT DOCUMENTS

| JP | 2010-508669 | 3/2010 |
| JP | 2011-258675 A | 12/2011 |

(Continued)

OTHER PUBLICATIONS

Akiya Kimura, et al., "Optical Characteristics and Reliability Evaluation of Wafer Level White LED Package" Electronic Components and Technology Conference (ECTC), IEEE $62^{nd}$, 2012, pp. 1394-1399.

*Primary Examiner* — Benjamin Sandvik
*Assistant Examiner* — Farid Khan
(74) *Attorney, Agent, or Firm* — Oblon, McClelland, Maier & Neustadt, L.L.P.

(57) ABSTRACT

According to one embodiment, a semiconductor light emitting element includes: a first conductive pillar extending in a first direction; a second conductive pillar extending in the first direction; a first semiconductor layer of a first conductivity type provided on the first conductive pillar; a light emitting layer provided on the first semiconductor layer; a second semiconductor layer of a second conductivity type provided on the light emitting layer and on the second conductive pillar; a sealing unit covering a side surface of the first conductive pillar and a side surface of the second conductive pillar; and a light transmissive layer provided on the second semiconductor layer and having light transmissivity, a hardness of an upper surface portion of the light transmissive layer being higher than a hardness of a lower portion between the upper surface portion and the second semiconductor layer.

14 Claims, 7 Drawing Sheets

(56) References Cited

U.S. PATENT DOCUMENTS

| | | | |
|---|---|---|---|
| 2010/0140640 A1 | 6/2010 | Shimokawa et al. | |
| 2011/0297987 A1* | 12/2011 | Koizumi et al. | 257/98 |
| 2012/0217523 A1* | 8/2012 | Chang et al. | 257/98 |
| 2012/0217865 A1* | 8/2012 | Cabalu et al. | 313/483 |
| 2012/0320607 A1* | 12/2012 | Kinomoto et al. | 362/351 |
| 2013/0015483 A1* | 1/2013 | Shimokawa et al. | 257/98 |
| 2013/0026514 A1* | 1/2013 | Lin et al. | 257/98 |
| 2013/0069102 A1 | 3/2013 | Kimura et al. | |
| 2013/0082294 A1 | 4/2013 | Nakayama et al. | |
| 2013/0248910 A1 | 9/2013 | Kimura et al. | |
| 2013/0248917 A1 | 9/2013 | Obata et al. | |
| 2013/0256727 A1 | 10/2013 | Higuchi et al. | |

FOREIGN PATENT DOCUMENTS

| | | |
|---|---|---|
| JP | 2013-065773 A | 4/2013 |
| JP | 2013-069815 A | 4/2013 |
| JP | 2013-201156 A | 10/2013 |
| JP | 2013-247301 A | 12/2013 |
| WO | WO 2009/019836 A2 | 2/2009 |

\* cited by examiner

SEMICONDUCTOR LIGHT EMITTING ELEMENT AND METHOD FOR MANUFACTURING SAME

CROSS-REFERENCE TO RELATED APPLICATIONS

This application is based upon and claims the benefit of priority from Japanese Patent Application No. 2013-044547, filed on Mar. 6, 2013; the entire contents of which are incorporated herein by reference.

FIELD

Embodiments described herein relate generally to a semiconductor light emitting element and a method for manufacturing same.

BACKGROUND

A semiconductor light emitting element is mounted on various mounting members to form lighting equipment, display devices, etc. It is important for the semiconductor light emitting element to be high in the productivity in mounting.

DETAILED DESCRIPTION

In general, according to one embodiment, a semiconductor light emitting element includes: a first conductive pillar extending in a first direction; a second conductive pillar provided apart from the first conductive pillar in a second direction crossing the first direction and extending in the first direction; a first semiconductor layer of a first conductivity type provided on the first conductive pillar; a light emitting layer provided on the first semiconductor layer; a second semiconductor layer of a second conductivity type provided on the light emitting layer and on the second conductive pillar; a sealing unit covering a side surface of the first conductive pillar and a side surface of the second conductive pillar; and a light transmissive layer provided on the second semiconductor layer and having light transmissivity, a hardness of an upper surface portion of the light transmissive layer being higher than a hardness of a lower portion between the upper surface portion and the second semiconductor layer.

In general, according to another embodiment, a method for manufacturing a semiconductor light emitting element includes: forming a first semiconductor film, a light emitting film, and a second semiconductor film sequentially on a substrate; removing part of the light emitting film and part of the second semiconductor film to expose part of the first semiconductor film; forming a first electrode on a portion where the second semiconductor film remains and forming a second electrode on the exposed first semiconductor film; forming a first conductive pillar on the first electrode, forming a second conductive pillar on the second electrode, and forming a sealing unit covering a side surface of the first conductive pillar and a side surface of the second conductive pillar; removing the substrate; and forming a light transmissive layer having light transmissivity on a surface of the first semiconductor film exposed by removing the substrate, a hardness of a surface portion of the light transmissive layer being higher than a hardness of a portion between the surface portion and the first semiconductor film.

Hereinbelow, embodiments are described with reference to the drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

Figure 1:
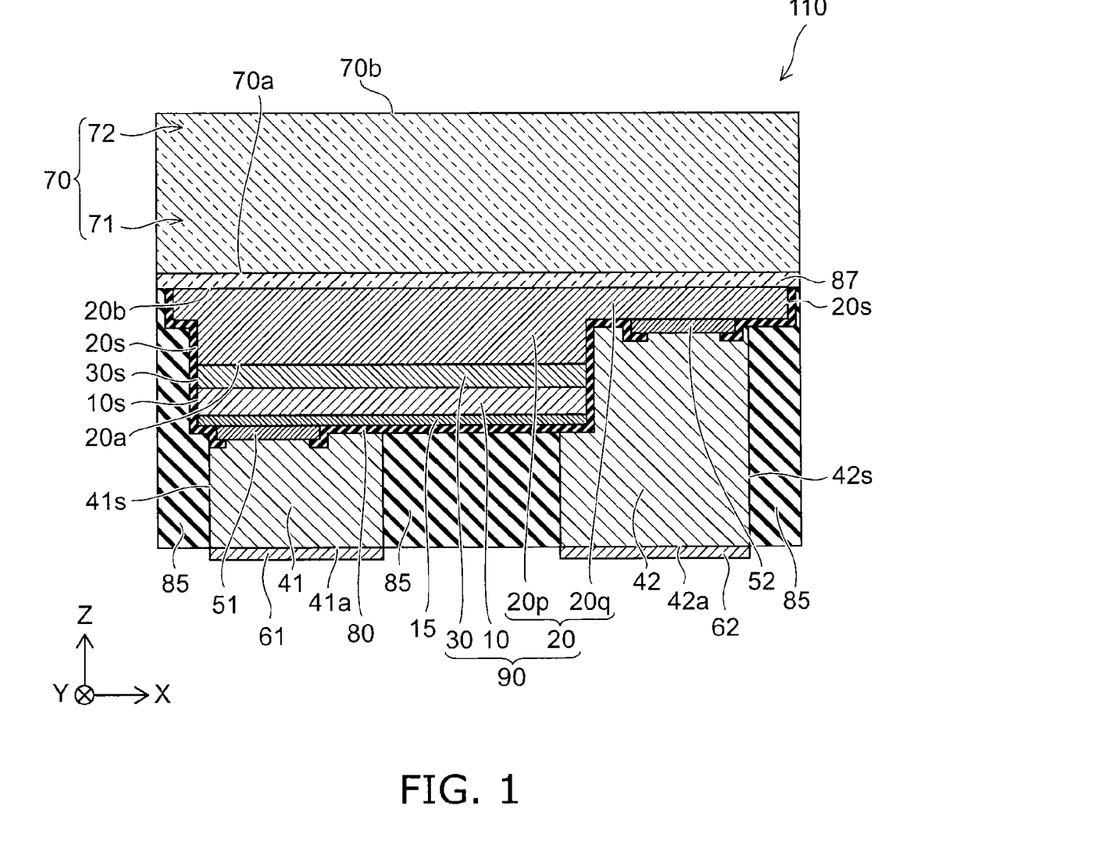
FIG. 1 is a schematic cross-sectional view illustrating a semiconductor light emitting element according to a first embodiment.

FIG. 1 is a schematic cross-sectional view illustrating a semiconductor light emitting element according to a first embodiment. As shown in FIG. 1, a semiconductor light emitting element 110 according to the embodiment includes a first conductive pillar 41, a second conductive pillar 42, a first electrode 51, a second electrode 52, a stacked body 90, a sealing unit 85, and a light transmissive layer 70. The stacked body 90 includes a first semiconductor layer 10, a second semiconductor layer 20, and a light emitting layer 30.

The first electrode 51, the first semiconductor layer 10, the light emitting layer 30, and the second semiconductor layer 20 are stacked in this order on the first conductive pillar 41. The second semiconductor layer 20 is provided also on the second electrode 52 provided on the second conductive pillar 42.

In the specification of this application, the state of being "provided on" includes not only the state of being provided in direct contact but also the state of being provided via another layer.

The direction from the first semiconductor layer 10 toward the second semiconductor layer 20 is defined as a stacking direction (the Z-axis direction). One direction orthogonal to the Z-axis direction is defined as the X-axis direction. The direction orthogonal to the Z-axis direction and the X-axis direction is defined as the Y-axis direction.

The first conductive pillar 41 and the second conductive pillar 42 extend in the stacking direction (a first direction). The second conductive pillar 42 is apart from the first conductive pillar 41 in a direction crossing the first direction, that is, a direction (a second direction) non-parallel to the first direction. In this example, the first direction is the Z-axis direction, and the second direction is the X-axis direction.

The first electrode 51 is provided on the first conductive pillar 41. The first electrode 51 is electrically connected to the first conductive pillar 41.

The second electrode 52 is provided on the second conductive pillar 42. The second electrode 52 is electrically connected to the second conductive pillar 42.

The first semiconductor layer 10 is provided on the first electrode 51. The light emitting layer 30 is provided on the first semiconductor layer 10. The second semiconductor layer 20 is provided on the light emitting layer 30 and on the second electrode 52.

The first semiconductor layer 10 is a first conductivity type, and the second semiconductor layer 20 is a second conductivity type. The first conductivity type is the p type, and the second conductivity type is the n type, for example. The first conductivity type may be the n type, and the second conductivity type may be the p type. In the following examples, the first conductivity type is the p type and the second conductivity type is the n type.

The first semiconductor layer 10 has a first side surface 10s. The second semiconductor layer 20 has a second side surface 20s. The light emitting layer 30 has a third side surface 30s. The first conductive pillar 41 has a fourth side surface 41s. The second conductive pillar 42 has a fifth side surface 42s. These side surfaces cross the X-Y plane. That is, they are non-parallel to the X-Y plane.

The sealing unit 85 covers at least the fourth side surface 41s and the fifth side surface 42s. In this example, the sealing unit 85 is provided also on the first side surface 10s, the second side surface 20s, and the third side surface 30s.

The light transmissive layer 70 is provided on the second semiconductor layer 20. The light transmissive layer 70 has light transmissivity. The light transmissive layer 70 has a first major surface 70a and a second major surface 70b. The first major surface 70a is a surface opposing the second semiconductor layer 20. The second major surface 70b is the surface on the opposite side to the first major surface 70a. The first major surface 70a is the lower surface, and the second major surface 70b is the upper surface.

In the specification of this application, the state of "opposing" includes not only the state of facing directly but also the state of facing via another component.

In this example, the semiconductor light emitting element 110 further includes an intermediate layer 87. The intermediate layer 87 is provided between the second semiconductor layer 20 and the light transmissive layer 70. The intermediate layer 87 that is light transmissive enhances the adhesion between the stacked body 90 (the second semiconductor layer 20) and the light transmissive layer 70, for example.

By applying a voltage between the first conductive pillar 41 and the second conductive pillar 42, a current is supplied to the light emitting layer 30 via the first electrode 51, the first semiconductor layer 10, the second electrode 52, and the second semiconductor layer 20. Carriers (e.g. holes) are injected into the first semiconductor layer 10 from the first electrode 51, for example. Carriers (e.g. electrons) are injected into the second semiconductor layer 20 from the second electrode 52, for example. Thereby, light is emitted from the light emitting layer 30. The light is emitted mainly from the upper surface of the second semiconductor layer 20 to the outside of the semiconductor light emitting element 110 via the light transmissive layer 70 (and the intermediate layer 87) having light transmissivity. The second major surface 70b of the light transmissive layer 70 forms a light emitting surface. The wavelength (peak wavelength) of the emission light emitted from the light emitting layer 30 is not less than 370 nm and not more than 700 nm, for example.

The light transmissive layer 70 includes a first portion 71 and a second portion 72. The first portion 71 is disposed near the second semiconductor layer 20. The second portion 72 is disposed on the first portion 71. The second portion 72 includes at least part of the second major surface 70b, for example. The second portion 72 is an upper surface portion of the light transmissive layer 70. The first portion 71 is a lower portion of the light transmissive layer 70. The first portion 71 is provided between the second portion 72 and the second semiconductor layer 20.

In the embodiment, the second portion 72 is harder than the first portion 71. The hardness of the second portion 72 is higher than the hardness of the first portion 71. At least one of the material and the processing conditions of the second portion 72 is different from that of the second portion 71, for example. In the case where the light transmissive layer 70 contains particles (e.g. fillers, talc, etc.), the concentration of particles in the second portion 72 is higher than the concentration of particles in the first portion 71, for example.

The light transmissive layer 70 protects the light emitting unit (e.g. the second semiconductor layer 20), for example. As described later, the light transmissive layer 70 may have the function of converting the wavelength of the light emitted from the light emitting layer 30.

A resin material having light transmissivity is used for the light transmissive layer 70, for example. A soft material is used for at least the first portion 71 opposing the second semiconductor layer 20 of the light transmissive layer 70. Thereby, damage can be suppressed even when stress is applied to the element during manufacturing processes or during use, for example. Furthermore, the adhesion to the second semiconductor layer 20 (or the intermediate layer 87) can be enhanced.

In the semiconductor light emitting element 110 according to the embodiment, a substrate on which a semiconductor layer is formed by crystal growth is removed after the crystal growth. The semiconductor layer is held by the light transmissive layer 70 and the sealing layer 85, for example. That is, the semiconductor light emitting element 110 is a thin film light emitting element. Since the substrate has been removed, the semiconductor light emitting element 110 is lighter in weight than when the substrate is not removed.

An investigation by the inventors of this application has revealed that in such a light thin film light emitting element, the light emitting element is less easily separated from a mounting tool in the mounting process, and this may cause a decrease in productivity. When a soft material is used as the light transmissive layer 70 as mentioned above, the light transmissive layer 70 is likely to become deformed. When the light transmissive layer 70 is likely to become deformed, the adhesion to a tool etc. is high. The tackiness of the surface of the light transmissive layer 70 is high. It has been found that this problem is serious particularly when the element is light in weight in such a case.

The second major surface 70b of the light transmissive layer 70 is a surface that a cover tape of an embossed tape for housing a semiconductor element, an electronic component, etc. comes into contact with, for example. The second major surface 70b is a surface that comes into contact with a nozzle of a mounting apparatus for mounting the semiconductor light emitting element 110, for example. Thus, in the mounting process of the semiconductor light emitting element 110, various members and tools come into contact with the second portion 72 (upper portion) including the second major surface 70b. If the hardness of the second major surface 70b is low, the tackiness of the second major surface 70b is high. If the tackiness of the second major surface 70b of the light transmissive layer 70 is high, the light transmissive layer 70 may be attached to a cover tape, and defective supply to a mounting apparatus is likely to occur. Furthermore, when the light transmissive layer 70 side of the semiconductor light emitting element 110 is sucked by a nozzle of a mounting apparatus and is transferred to a prescribed position in the mounting process, the semiconductor light emitting element 110 may remain sucked to the nozzle even when the suction of the nozzle is suspended, and defective release may occur, for example.

Such a problem that reduces productivity is serious particularly in the thin film light emitting element.

The embodiment solves the newly found issue described above.

In the embodiment, an upper surface portion of the light transmissive layer 70 is selectively made hard. That is, the hardness of the second portion 72 including the second major surface 70b of the light transmissive layer 70 is made higher than the hardness of the first portion 72. Thereby, the tackiness of the surface of the light transmissive layer 70 is reduced, and defective release in the attachment to a cover tape and mounting can be suppressed. Thus, the productivity in mounting can be improved.

In the embodiment, the light transmissive layer 70 has the first portion 71 with a lower hardness than the second portion 72. Thereby, damage can be suppressed even when stress is applied to the element, and high adhesion is obtained. That is, the productivity in mounting can be improved while high reliability is obtained.

Thus, in the semiconductor light emitting element 110 according to the embodiment, the productivity in mounting can be improved while high reliability is obtained and practicality is maintained.

The hardness of the second portion 72 is higher than the hardness of the first portion 71. The tensile elastic modulus of the second portion 72 is higher than the tensile elastic modulus of the first portion 71.

In the embodiment, the first semiconductor layer 10 contains a nitride semiconductor, for example. The first semiconductor layer 10 includes a first p-side layer, for example. The first p-side layer is a p-type cladding layer, for example. The thickness (the length along the Z-axis direction) of the first semiconductor layer 10 is not less than 5 nm and not more than 300 nm, for example. The thickness of the first semiconductor layer 10 is 100 nm, for example.

The second semiconductor layer 20 has a third major surface 20a and a fourth major surface 20b. The third major surface 20a is the surface opposing the light emitting layer 30. The fourth major surface 20b is on the opposite side to the third major surface 20a.

The second semiconductor layer 20 includes a first semiconductor portion 20p and a second semiconductor portion 20q. When projected onto a plane perpendicular to the stacking direction (the X-Y plane), the first semiconductor portion 20p overlaps with the first semiconductor layer 10. When projected onto the X-Y plane, the second semiconductor portion 20q does not overlap with the first semiconductor layer 10. When projected onto the X-Y plane, the first semiconductor portion 20p and the second semiconductor portion 20q are juxtaposed.

The second semiconductor layer 20 contains a nitride semiconductor, for example. The second semiconductor layer 20 includes a first n-side layer, for example. The first n-side layer is an n-type cladding layer, for example. The thickness (the length along the Z-axis direction) of the second semiconductor layer 20 is not less than 1 μm and mot more than 10 μm, for example. The thickness of the second semiconductor layer 20 is 5 μm, for example.

In the semiconductor light emitting element 110, the fourth major surface 20b of the second semiconductor layer 20 forms a light extraction surface. Fine unevenness may be formed on the fourth major surface 20b by performing frost treatment by wet etching processing, dry etching processing, or the like on the fourth major surface 20b, for example. Thereby, the total reflection at the fourth major surface 20b of the light emitted from the light emitting layer 30 is suppressed, and the light extraction efficiency of the semiconductor light emitting element 110 is improved, for example.

The light emitting layer 30 is provided between the first semiconductor portion 20p of the second semiconductor layer 20 and the first semiconductor layer 10. The thickness of the light emitting layer 30 is not less than 5 nm and not more than 100 nm, for example. The thickness of the light emitting layer 30 is 10 nm, for example.

The light emitting layer 30 has a single quantum well (SQW) configuration or a multi quantum well (MQW) configuration, for example.

The light emitting layer 30 having a single quantum well configuration includes two barrier layers and a well layer provided between the barrier layers. The light emitting layer 30 having a multi quantum well configuration includes three or more barrier layers and well layers each provided between barrier layers, for example. A plurality of barrier layers and a plurality of well layers are alternately stacked along the Z-axis direction, for example.

The light emitting layer 30 contains a nitride semiconductor, for example. $In_{x1}Ga_{1-x1}N$ ($0 \le x1 < 1$) is used for the barrier layer, for example. $In_{x2}Ga_{1-x2}N$ ($0 < x2 \le 1$, $x1 < x2$) is used for the well layer, for example. In the case where the barrier layer contains In, the composition ratio of In in the barrier layer is set lower than the composition ratio of In in the well layer. Alternatively, the barrier layer substantially does not contain In. The band gap energy in the barrier layer is larger than the band gap energy in the well layer.

The first conductive pillar 41 is electrically connected to the first semiconductor layer 10. In this example, the first conductive pillar 41 is electrically connected to the first semiconductor layer 10 via the first electrode 51 and a reflection layer 15 (described later). Part of the first conductive pillar 41 may be used as the first electrode 51. The first conductive pillar 41 has a first end 41a on the opposite side to the side opposing the first electrode 51.

The second conductive pillar 42 is electrically connected to the second semiconductor layer 20. Part of the second conductive pillar 42 may be used as the second electrode 52. The second conductive pillar 42 has a second end 42a on the opposite side to the side opposing the second electrode 52. The first end 41a of the first conductive pillar 41 and the second end 42a of the second conductive pillar 42 are not covered with the sealing unit 85.

A material having electrical conductivity is used for the first conductive pillar 41 and the second conductive pillar 42. A metal material such as copper is used for the first conductive pillar 41 and the second conductive pillar 42, for example. The first conductive pillar 41 may be provided in plural. The second conductive pillar 42 may be provided in plural. The first conductive pillar 41 and the second conductive pillar 42 are in a circular columnar shape (including a flat circular columnar shape) or a polygonal columnar shape, for example. The length along the stacking direction (height) of the first conductive pillar 41 and the second conductive pillar 42 is arbitrary. The distance along the stacking direction between the fourth major surface 20b of the second semiconductor layer 20 and the first end 41a is set equal to the distance along the stacking direction between the fourth major surface 20b and the second end 42a, for example.

The first electrode 51 is provided between the first semiconductor layer 10 and the first conductive pillar 41. The second electrode 52 is provided between the second semiconductor layer 20 and the second conductive pillar 42. The second electrode 52 is provided on the third major surface 20a side of the second semiconductor layer 20, for example. The second electrode 52 is provided to oppose the second semiconductor portion 20q of the second semiconductor layer 20, for example.

A material having electrical conductivity is used for the first electrode 51 and the second electrode 52. A metal material such as Ni/Au is used for the first electrode 51 and the second electrode 52, for example.

A conductive layer (not shown) may be further provided between the first conductive pillar 41 and the first electrode 51 and between the second conductive pillar 42 and the second electrode 52, for example. A metal material such as copper is used for the conductive layer, for example.

The sealing unit 85 holds the stacked body 90 (the first semiconductor layer 10, the second semiconductor layer 20, and the light emitting layer 30), the first conductive pillar 41, and the second conductive pillar 42, for example. The sealing unit 85 protects the stacked body 90, the first conductive pillar 41, and the second conductive pillar 42, for example. The sealing unit 85 is insulating. An insulating resin is used for the sealing unit 85, for example. An epoxy resin is used for the sealing unit 85, for example. The sealing unit 85 contains quartz fillers, alumina fillers, or the like, for example. Thereby, the thermal conductivity of the sealing unit 85 is improved, and heat dissipation performance can be enhanced.

The refractive index of the light transmissive layer 70 is not less than 1.0 and not more than 2.0, for example. The refractive index of the light transmissive layer 70 is preferably set as small as possible in the range mentioned above. The light extraction efficiency is improved by bringing the refractive index of the light transmissive layer 70 close to the refractive index of air. The refractive index of the light transmissive layer 70 is 1.5, for example.

The refractive index may be differentiated between the first portion 71 and the second portion 72 of the light transmissive layer 70. The refractive index of the second portion 72 that forms a light emitting surface is made lower, for example. The refractive index of the second portion 72 is lower than the refractive index of the first portion 71, for example. The light extraction efficiency is improved by setting low the refractive index of the portion that forms a light emitting surface.

A resin layer having light transmissivity is used as the light transmissive layer 70, for example. The resin layer contains a silicone resin, for example. The resin layer contains methyl phenyl silicone, for example. In the case where the luminance of the light emitted from the light emitting layer 30 is low and there is little degradation due to blue light, an epoxy resin, a mixed resin of an epoxy resin and a silicone resin, a urethane resin, or the like may be used.

The light transmissive layer 70 may be one layer, or the light transmissive layer 70 may include a plurality of layers.

The thickness of the light transmissive layer 70 is not less than 10 μm and not more than 300 μm, for example. The thickness of the light transmissive layer 70 is 120 μm, for example.

In this example, the semiconductor light emitting element 110 further includes a reflection layer 15, a first terminal 61, a second terminal 62, and an insulating layer 80.

The reflection layer 15 is provided between the first electrode 51 and the first semiconductor layer 10, for example. The reflection layer 15 reflects the light emitted from the light emitting layer 30. The reflectance of the reflection layer 15 for the light emitted from the light emitting layer 30 is higher than the reflectance of the sealing unit 85 for the light emitted from the light emitting layer 30, for example. Thereby, the light emission efficiency of the semiconductor light emitting element 110 can be improved, for example. A metal material such as Ag and Al or a metal stacked film containing them is used as the reflection layer 15, for example. The thickness of the reflection layer 15 is not less than 0.2 μm and not more than 0.4 μm, for example. The thickness of the reflection layer 15 is 0.3 μm, for example.

The first terminal 61 is provided on the first end 41a side of the first conductive pillar 41. The first conductive pillar 41 is provided on the first terminal 61. The first terminal 61 is electrically connected to the first conductive pillar 41. The first terminal 61 is in contact with the first end 41a of the first conductive pillar 41, and is connected with electrical continuity to the first conductive pillar 41, for example.

The second terminal 62 is provided on the second end 42a side of the second conductive pillar 42. The second conductive pillar 42 is provided on the second terminal 62. The second terminal 62 is apart from the first terminal 61 in the second direction mentioned above. The second terminal 62 is electrically connected to the second conductive pillar 42. The second terminal 62 is in contact with the second end 42a of the second conductive pillar 42, and is connected with electrical continuity to the second conductive pillar 42, for example.

The first terminal 61 and the second terminal 62 are used for the electrical connection between the semiconductor light emitting element 110 and an external device, for example. In this example, the first terminal 61 is a p-side anode, and the second terminal 62 is an n-side cathode. When the semiconductor light emitting element 110 is used, a voltage is applied between the first terminal 61 and the second terminal 62 so that the first terminal 61 is positive and the second terminal 62 is negative. Thereby, a forward voltage is applied to the stacked body 90, and light is emitted from the light emitting layer 30.

A material having electrical conductivity such as a metal material is used for the first terminal 61 and the second terminal 62, for example. The first terminal 61 and the second terminal 62 may have a single-layer structure using one material, or may have a stacked structure using a plurality of materials, for example.

Part of the insulating layer 80 is provided between part of the first semiconductor layer 10 and part of the sealing unit 85, between part of the light emitting layer 30 and part of the sealing unit 85, and between part of the second semiconductor layer 20 and part of the sealing unit 85, for example. The insulating layer 80 covers the first side surface 10s (the first semiconductor layer 10), the second side surface 20s (the second semiconductor layer 20), and the third side surface 30s (the light emitting layer 30), for example.

Part of the insulating layer 80 is provided also in a portion between part of the first semiconductor layer 10 and part of the second conductive pillar 42, between part of the light emitting layer 30 and the second conductive pillar 42, and in a portion between the second semiconductor layer 20 and the second conductive pillar 42, for example. In the case where the semiconductor light emitting element 110 includes the reflection layer 15, part of the insulating layer 80 is provided also between part of the reflection layer 15 and part of the sealing unit 85, between part of the reflection layer 15 and part of the first conductive pillar 41, and between part of the reflection layer 15 and part of the second conductive pillar 42.

The first semiconductor layer 10 and the second conductive pillar 52 are electrically insulated by the insulating layer 80. The insulation between the first semiconductor layer 10, the second semiconductor layer 20, the light emitting layer 30, and the reflection layer 15, and the sealing unit 85 is enhanced by the insulating layer 80, for example. By providing the insulating layer 80, the first semiconductor layer 10, the second semiconductor layer 20, and the light emitting layer 30 are protected from impurities and the like contained in the sealing unit 85.

For the insulating layer 80, for example, an inorganic material such as $SiO_2$, SiN, phosphorus silicate glass (PSG), and boron phosphorus silicate glass (BPSG) is used. For the insulating layer 80, for example, also an organic material such as a polyimide and benzocyclobutene may be used. The organic material used may have photosensitivity. A stacked body of an inorganic film and an organic film may be used.

The thickness of the insulating layer 80 is not less than 100 nm and not more than 1000 nm, for example. The thickness of the insulating layer 80 is approximately 400 nm, for example. CVD, vapor deposition, sputtering, and the like are used for the formation of the insulating layer 80, for example. Also the application method may be used.

A light transmissive material is used for the intermediate layer 87. An inorganic material such as silicon oxide and silicon nitride and an organic material such as a silicone resin are used for the intermediate layer 87, for example. The thickness of the intermediate layer 87 is not less than 0.1 μm and not more than 10 μm, for example.

The refractive index of the intermediate layer 87 may be set higher than the refractive index of the light transmissive layer 70, for example. Thereby, the light extraction efficiency of the semiconductor light emitting element 110 can be enhanced.

When projected onto a plane perpendicular to the stacking direction (the X-Y plane), the external shape of the semiconductor light emitting element 110 is rectangular, for example. One side of the semiconductor light emitting element 110 is parallel to the X-axis direction, for example. Another side of the semiconductor light emitting element 110 is parallel to the Y-axis direction, for example. When projected onto the X-Y plane, the length (width) of a side along the X-axis direction of the semiconductor light emitting element 110 is not less than 100 μm and not more than 1000 μm, for example, and is 600 μm, for example. When projected onto the X-Y plane, the length (width) of a side along the Y-axis direction of the semiconductor light emitting element 110 is not less than 100 μm and not more than 1000 μm, for example, and is 600 μm, for example.

The second direction from the first conductive pillar 41 toward the second conductive pillar 42 may not be parallel to the X-axis direction. The second direction may not be parallel to the Y-axis direction. The second direction may cross (that is, may be non-parallel to) a side of the semiconductor light emitting element 110.

A method for manufacturing the semiconductor light emitting element 110 will now be described.

FIG. 2A to FIG. 2E are schematic cross-sectional views in order of the processes, illustrating a method for manufacturing a semiconductor light emitting element according to the first embodiment.

Figure 3A:
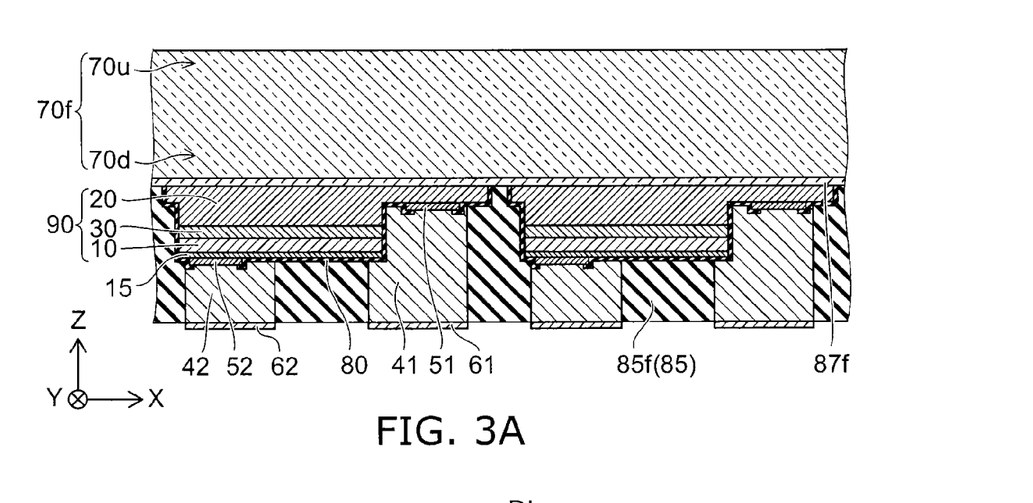
FIG. 3A and FIG. 3B are schematic cross-sectional views in order of the processes, illustrating the method for manufacturing a semiconductor light emitting element according to the first embodiment.
Figure 3B:
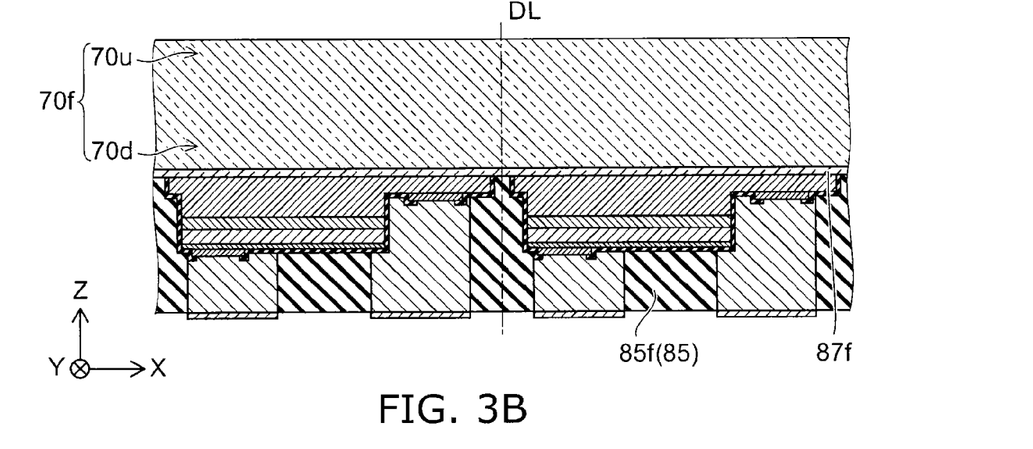

FIG. 3A and FIG. 3B are schematic cross-sectional views in order of the processes, illustrating the method for manufacturing a semiconductor light emitting element according to the first embodiment.

Figure 2A:
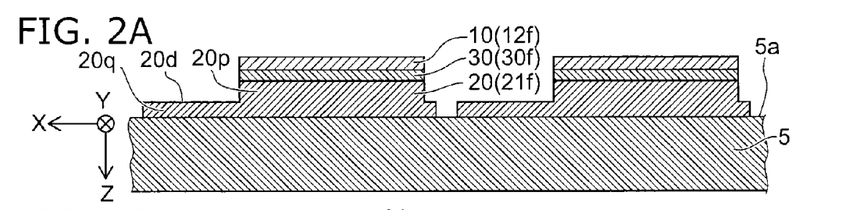
FIG. 2A to FIG. 2E are schematic cross-sectional views in order of processes, illustrating a method for manufacturing a semiconductor light emitting element according to the first embodiment.

As shown in FIG. 2A, a stacked body film 90f that forms the stacked body 90 is formed on the surface 5a of a growth substrate 5. A substrate such as a semiconductor substrate is used as the growth substrate 5, for example. A silicon (Si) substrate is used as the growth substrate 5, for example. The growth substrate 5 may be sapphire. The metal organic chemical vapor deposition (MOCVD) method is used for the formation of the stacked body film 90f, for example.

In the formation of the stacked body film 90f, a first semiconductor film 21f, a light emitting film 30f, and a second semiconductor film 12f are formed in this order on the growth substrate 5 by crystal growth (epitaxial growth). The first semiconductor film 21f forms the second semiconductor layer 20. The light emitting film 30f forms the light emitting layer 30. The second semiconductor film 12f forms the first semiconductor layer 10.

A buffer layer (not shown) may be provided between the growth substrate 5 and the first semiconductor film 21f. The crystallinity of the stacked body 90 (the second semiconductor layer 20) is enhanced by the buffer layer, for example. Stress is relaxed by the buffer layer, for example.

Part of the second semiconductor film 12f and part of the light emitting film 30f are removed from the second semiconductor film 12f side by lithography processing and etching processing, and part of the first semiconductor film 21f is exposed, for example. At this time, part of the first semiconductor film 21f may be removed. Thereby, a recess 20d is formed in the first semiconductor film 21f. The exposed portion where the recess 20d is formed forms the second semiconductor portion 20q. The other portion forms the first semiconductor portion 20p. Thereby, the stacked body 90 including the first semiconductor layer 10, the second semiconductor layer 20, and the light emitting layer 30 is formed.

As shown in FIG. 2A, in this example, a plurality of stacked bodies 90 are formed on the surface 5a of the growth substrate 5.

Figure 2B:
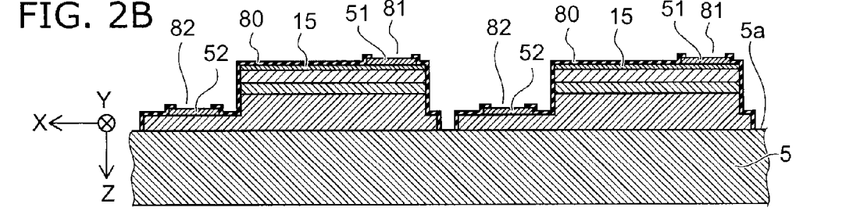

As shown in FIG. 2B, the reflection layer 15 is formed on the first semiconductor layer 10 of each of the plurality of stacked bodies 90 by film formation processing, lithography processing, and etching processing.

An electrode film 50f is film-formed on the plurality of reflection layers 15 and the plurality of second semiconductor portions 20q. The electrode film 50f forms the first electrode 51 and the second electrode 52, for example. The first electrode 51 and the second electrode 52 are formed simultaneously, for example. The first electrode 51 and the second electrode 52 may be formed separately. In this case, a first electrode film 51f that forms the first electrode 51 is film-formed on the reflection layer 15, and a second electrode film 52f that forms the second electrode 52 is film-formed on the second semiconductor portion 20q of the second semiconductor layer 20.

The electrode film 50f is processed by lithography processing and etching processing. Thereby, the first electrode 51 is formed on each of the plurality of reflection layers 15. The second electrode 52 is formed on the second semiconductor portion 20q of each of the plurality of second semiconductor layers 20.

An insulating film 80f that forms the insulating layer 80 is formed on each of the plurality of stacked bodies 90 and each of the reflection layers 15. Lithography processing and etching processing are performed on the formed insulating film 80f to form a first opening 81 and a second opening 82.

Thereby, the insulating layer 80 is formed. The first electrode 51 is exposed at the first opening 81. The second electrode 52 is exposed at the second opening 82.

Figure 2C:
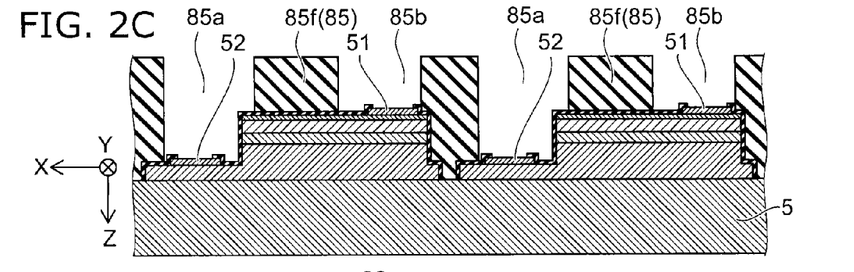

As shown in FIG. 2C, a sealing film 85f that forms the sealing unit 85 is formed on a region on the first semiconductor layer 10 where the first electrode 51 is not formed and a region on the second semiconductor layer 20 where the second electrode 52 is not formed. The sealing film 85f is formed on each of the insulating layers 80 on the plurality of stacked bodies 90 and on the growth substrate 5, for example. The sealing film 85f is a resin film, for example.

A first through hole 85a and a second through hole 85b are formed in the sealing film 85f. The first through hole 85a leads to the first electrode 51. The second through hole 85b leads to the second electrode 52.

Figure 2D:
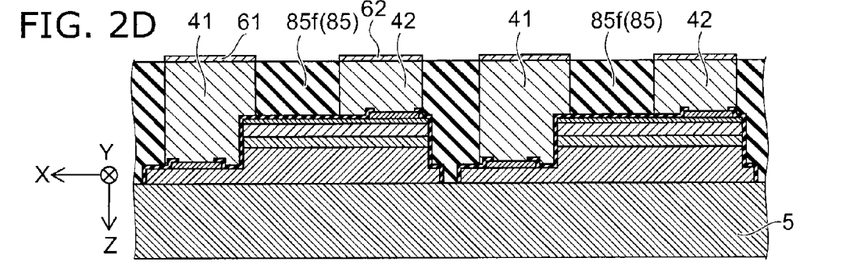

As shown in FIG. 2D, a conductive film 40f is formed so as to fill the first through hole 85a and the second through hole 85b. The conductive film 40f forms the first conductive pillar 41 and the second conductive pillar 42. In this case, the first conductive pillar 41 and the second conductive pillar 42 are formed simultaneously. It is also possible to separately form a first conductive film 41f that forms the first conductive pillar 41 and a second conductive film 42f that forms the second conductive pillar 42.

The conductive film 40f (the first conductive film 41f and the second conductive film 42f) is planarized by grinding or the like to form the first conductive pillar 41 and the second conductive pillar 42. The ground surface forms the first end 41a and the second end 42a.

In this example, the conductive film 40f (the first conductive pillar 41 and the second conductive pillar 42) is formed after the sealing film 85f (the sealing unit 85) is formed. In the embodiment, it is also possible to form the sealing film 85f (the sealing unit 85) after the conductive film 40f (the first conductive film 41f and the second conductive film 42f) is formed.

Using film formation processing, lithography processing, and etching processing, the first terminal 61 is formed on the first end 41a of the first conductive pillar 41, and the second terminal 62 is formed on the second end 42a of the second conductive pillar 42, for example. The first terminal 61 and the second terminal 62 may be formed simultaneously, or may be formed separately.

Figure 2E:
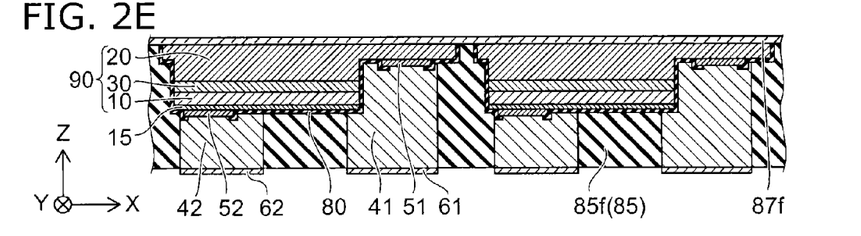

As shown in FIG. 2E, the growth substrate 5 is removed by the etching method, for example. In the case where the growth substrate 5 is, for example, sapphire, the growth substrate 5 may be removed by the laser lift-off method or the like.

In this example, an intermediate film 87f that forms the intermediate layer 87 is further formed on the second semiconductor layer 20 and the sealing film 85f exposed by removing the growth substrate 5.

As shown in FIG. 3A, a light transmissive film 70f that forms the light transmissive layer 70 is formed on the intermediate film 87f. The light transmissive film 70f is a resin film having light transmissivity, for example.

A liquid transparent resin is applied onto the intermediate film 87f and is processed for shaping by a method such as the screen printing method, potting, molding, and compression molding, and is cured by heating to form the light transmissive film 70f, for example.

The light transmissive film 70f includes an upper portion 70u that forms the second portion 72 and a lower portion 70d that forms the first portion 71. The light transmissive film 70f is formed such that the upper portion 70u is harder than the lower portion 70d. The formation conditions may be differentiated between the upper portion 70u and the lower portion 70d, for example. The material used (composition etc.) may be differentiated between the upper portion 70u and the lower portion 70d, for example.

The light transmissive film 70f may be one film, for example, or the light transmissive film 70f may include a plurality of films (stacked films). In the case where the light transmissive film 70f includes a plurality of films, the boundary between films may be observed or may not be observed.

As shown in FIG. 3B, the light transmissive film 70f, the intermediate film 87f, and the sealing film 85f are cut between stacked bodies 90. The light transmissive film 70f, the intermediate film 87f, and the sealing film 85f are cut along a dicing line DL, for example. Thereby, a plurality of semiconductor light emitting elements 110 are separated from one another. That is, the sealing unit 85, the intermediate layer 87, and the light transmissive layer 70 are formed, and the semiconductor light emitting element 110 is formed. In the semiconductor light emitting element 110, the tackiness at the upper surface (the second major surface 70b) is low. Thereby, the productivity when the semiconductor light emitting element 110 is mounted on another mounting member is increased, for example.

Figure 4:
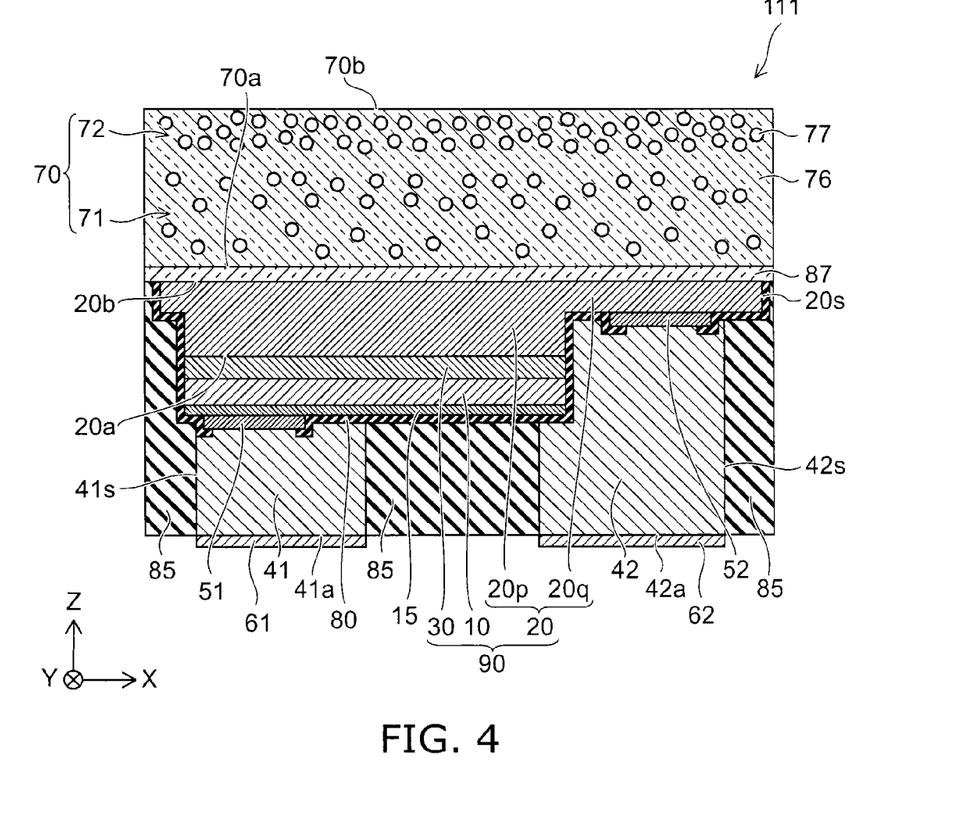
FIG. 4 is a schematic cross-sectional view illustrating another semiconductor light emitting element according to the first embodiment.

FIG. 4 is a schematic cross-sectional view illustrating another semiconductor light emitting element according to the first embodiment.

In a semiconductor light emitting element 111 shown in FIG. 4, the configuration other than the light transmissive layer 70 is the same as that of the semiconductor light emitting element 110. In the following, the light transmissive layer 70 is described in regard to the semiconductor light emitting element 111.

In the semiconductor light emitting element 111, the light transmissive layer 70 includes a resin unit 76 and a plurality of particles 77. The resin unit 76 contains a light transmissive resin, for example.

For the resin unit 76, for example, a silicone resin (e.g. methyl phenyl silicone), an epoxy resin, a mixed resin of an epoxy resin and a silicone resin, a urethane resin, or the like is used.

The plurality of particles 77 are dispersed in the resin unit 76, for example. The light transmissive layer 70 is formed by thermally curing a liquid resin in which a plurality of particles 77 are dispersed, for example. The average particle size of the plurality of particles 77 is not less than 1 μm and not more than 50 μm, for example.

A filler is used as the particle 77, for example. A filler of an inorganic material may be used as the filler, for example. $SiO_2$, $TiO_2$, or the like may be used for the particle 77, for example.

The particle 77 may include a fluorescent particle, for example. For the particle 77, for example, YAG:Ce in which cerium is introduced as an activator into yttrium aluminate is used. For the particle 77, for example, also $(Sr, Ba)_2SiO_4$, $Ca_p(Si, Al)_{12}$ in which europium is introduced as an activator into strontium barium silicate may be used.

In the case where a fluorescent particle is used as the particle 77, the light transmissive layer 70 functions as a wavelength conversion layer that converts the peak wavelength of the light emitted from the light emitting layer 30, for example. The light transmissive layer 70 absorbs at least part of a first light L1 (emission light) emitted from the light emitting layer 30 and emits a second light L2, for example. The peak wavelength of the second light L2 is different from the peak wavelength of the first light L1. The second light L2 may include a plurality of lights having a plurality of peak wavelengths different from the peak wavelength of the first light L1. The first light L1 emitted from the light emitting layer 30 is blue light, for example. The plurality of particles 77 are fluorescent particles that convert the first light L1 (blue light) to the second light L2 (yellow light), for example. The design is made such that the synthetic light of the first light L1 and the second light L2 is substantially white, for example.

In the light transmissive layer 70, the concentration of particles 77 is differentiated between the first portion 71 and the second portion 72 of the light transmissive layer 70 so that the hardness of the second portion 72 is higher than the hardness of the first portion 71, for example. The concentration of particles 77 in the second portion 72 is higher than the concentration of particles 77 in the first portion 71, for example. At least one of the material and the particle size may be differentiated between the particles 77 contained in the second portion 72 and the particles 77 contained in the first portion 71, for example. Also at this time, the hardness of the second portion 72 is made higher than the hardness of the first portion 71. The hardness of the second portion 72 is higher than the hardness of the first portion 71, and productivity is increased.

A concentration distribution in which the concentration of particles 77 in the light transmissive layer 70 increases along the direction from the first major surface 70a toward the second major surface 70b is provided so that the hardness of the second portion 72 is higher than the hardness of the first portion 71, for example.

When the concentration of particles 77 is uniform in the light transmissive layer 70, a color shift may occur in the light emitted from the semiconductor light emitting element, for example. That is, in the first light L1 emitted from the light emitting layer 30, when the angle between the travel direction of the first light L1 and the stacking direction (the Z-axis direction) is large, the optical path length in the light transmissive layer 70 is long as compared to when the angle is small. Therefore, in light of a larger angle, the ratio of the intensity of the second light L2 to the intensity of the first light L1 is higher. Accordingly, the degree of yellow color becomes higher as the angle becomes larger. Such light is perceived like a yellow ring, for example.

In contrast, in the embodiment, a concentration distribution is provided in which the concentration of particles 77 in the light transmissive layer 70 increases along the direction from the first major surface 70a toward the second major surface 70b, for example. Thereby, the concentration of particles 77 in the optical path can be made low when the angle between the travel direction of light and the Z-axis direction is large. That is, the change in the optical path length with the angle is corrected by the concentration distribution. Thereby, the occurrence of a color shift is suppressed in the semiconductor light emitting element 111.

Furthermore, since a portion with a high concentration of particles 77, which are fluorescent particles, is disposed in a position far from the light emitting layer 30, which is a heat generating source, the heat from the light emitting layer 30 is less likely to be transferred to particles 77. Thereby, the decrease in light emission efficiency due to thermal quenching is suppressed in the particle 77.

FIG. 5A to FIG. 5D are schematic cross-sectional views in order of the processes, illustrating a method for manufacturing a semiconductor light emitting element according to the first embodiment.

The drawings illustrate a method for forming the light transmissive layer 70 of the semiconductor light emitting element 111. In the manufacturing method described below, the processes other than the formation of the light transmissive layer 70 can use the method described in regard to FIG. 2A to FIG. 2E, for example.

Figure 5A:
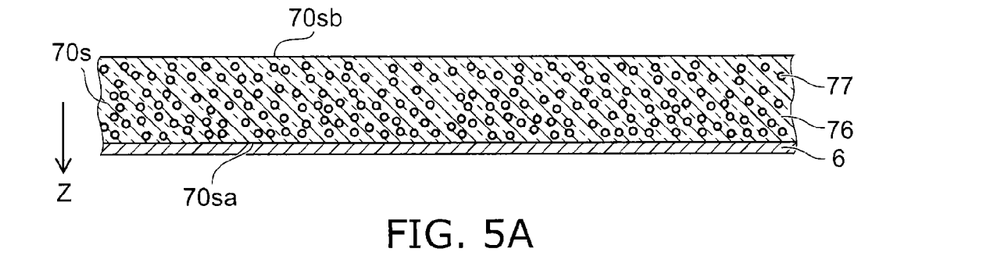
FIG. 5A to FIG. 5D are schematic cross-sectional views in order of the processes, illustrating a method for manufacturing a semiconductor light emitting element according to the first embodiment.

As shown in FIG. 5A, a light transmissive material layer 70s is formed on a support body 6. The light transmissive material layer 70s contains a plurality of particles 77. A liquid light transmissive resin in which a plurality of particles 77 are dispersed is applied onto the support body 6 to form a coating film (the light transmissive material layer 70s), for example. A thermosetting resin is used as the light transmissive resin, for example. A method such as the screen printing method, potting, molding, and compression molding is used for the formation of the light transmissive material layer 70s, for example. The light transmissive material layer 70s has a first surface 70sa and a second surface 70sb. The first surface 70sa opposes the support body 6. The second surface 70sb is the surface on the opposite side to the first surface 70sa.

Figure 5B:
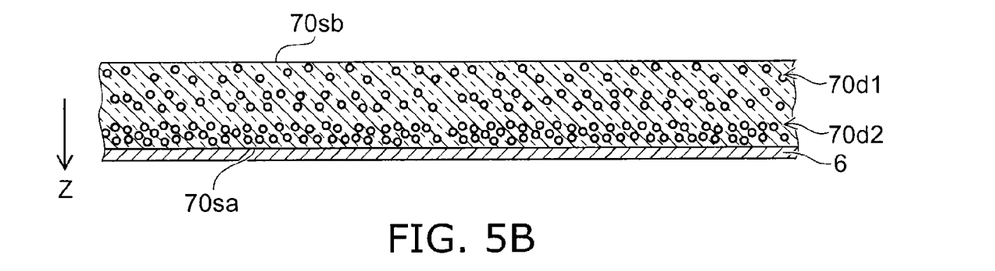

As shown in FIG. 5B, part of the plurality of particles 77 are caused to sink to the support body 6 side (the first surface 70sa side) in the light transmissive material layer 70s maintaining a liquid state. The conditions may be kept as they are after the layer (liquid layer) of the material that forms the light transmissive material layer 70s is formed on the support body 6; thereby, a concentration distribution is provided in the particles 77 along the direction from the first surface 70sa toward the second surface 70sb in the light transmissive material layer 70s, for example. Thereby, a low concentration portion 70d1 containing particles 77 at a first concentration and a high concentration portion 70d2 containing particles 77 at a second concentration higher than the first concentration are formed in the light transmissive material layer 70s. In this example, the second concentration portion 70d2 is formed between the support body 6 and the first concentration portion 70d1.

The light transmissive material layer 70s is heated to pre-cure the resin contained in the light transmissive material layer 70s (a first curing). The pre-curing is performed under conditions where the concentration distribution of the plurality of particles 77 is substantially maintained.

Figure 5C:
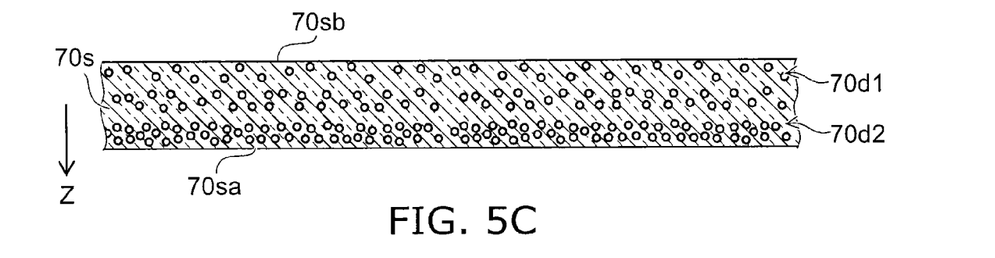

As shown in FIG. 5C, in this example, the light transmissive material layer 70s is peeled off from the support body 6.

Figure 5D:
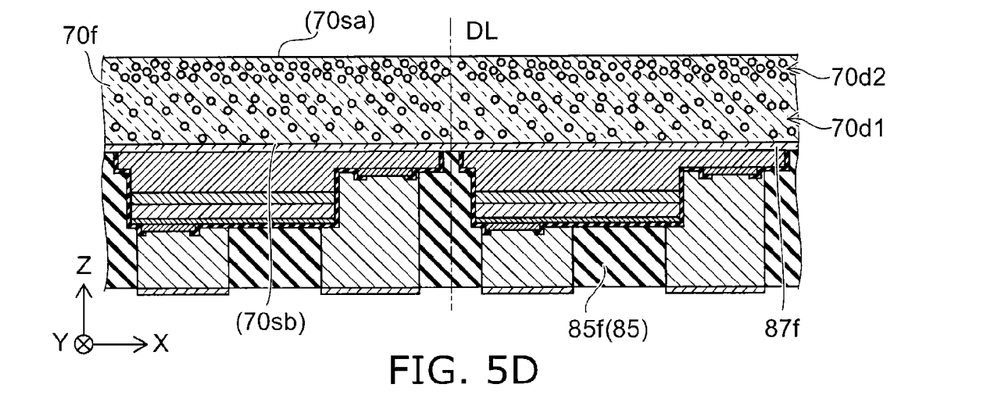

As shown in FIG. 5D, the light transmissive material layer 70s is stacked on the second semiconductor layer 20. In this example, the light transmissive material layer 70s is stacked on the intermediate film 87f. At this time, the stacking is made such that the second surface 70sb of the light transmissive material layer 70s opposes the second semiconductor layer 20 (the intermediate film 87f). Heating is performed to cure the resin contained in the light transmissive material layer 70s (a second curing). The temperature in the second curing is higher than the temperature in the first curing, for example. By the second curing, the light transmissive material layer 70s and the second semiconductor layer 20 (the intermediate film 87f) are joined together, for example. The light transmissive material layer 70s (the coating film) forms the light transmissive film 70f.

By such processes, a plurality of semiconductor light emitting elements 111 are formed to be aligned in a direction perpendicular to the stacking direction.

In this example, the light transmissive material layer 70s is stacked on the second semiconductor layer 20 after the light transmissive material layer 70s is peeled off from the support body 6. The embodiment is not limited thereto, and it is also possible to peel off the support body 6 after the light transmissive material layer 70s and the second semiconductor layer 20 are stacked, for example. In the case where the support body 6 is light transmissive and the hardness of the support body 6 is higher than the hardness of the light transmissive material layer 70s, the support body 6 may not be peeled off. In this case, the support body 6 forms an upper portion (the second portion 72) of the light transmissive layer 70.

The light transmissive film 70f, the intermediate film 87f, and the sealing film 85f are cut along a dicing line DL, for example. Thereby, the light transmissive film 70f forms the light transmissive layer 70, the intermediate film 87f forms the intermediate layer 87, and the sealing film 85f forms the sealing unit 85; thus, a plurality of semiconductor light emitting elements 111 are formed. The productivity in mounting can be improved in the semiconductor light emitting element 111, for example.

FIG. 6A to FIG. 6F are schematic cross-sectional views in order of the processes, illustrating a method for manufacturing a semiconductor light emitting element according to the first embodiment.

The drawings illustrate a method for manufacturing the light transmissive layer 70 of a semiconductor light emitting element 112. In the manufacturing method described below, the processes other than the formation of the light transmissive layer 70 may use the method described in regard to FIG. 2A to FIG. 2E, for example.

Figure 6A:
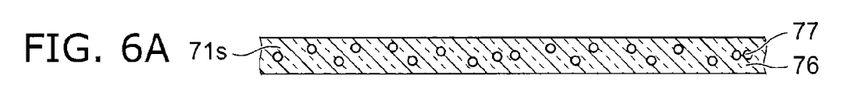
FIG. 6A to FIG. 6F are schematic cross-sectional views in order of the processes, illustrating a method for manufacturing a semiconductor light emitting element according to the first embodiment.
Figure 6B:
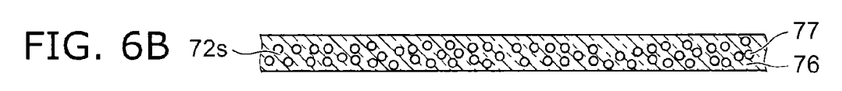
Figure 6C:
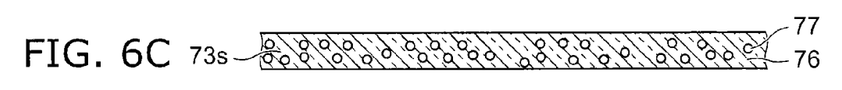

As shown in FIG. 6A to FIG. 6C, a first light transmissive material layer 71s, a second light transmissive material layer 72s, and a third light transmissive material layer 73s are formed. A first solution in which a plurality of particles 77 are dispersed in a first light transmissive resin is used for the formation of the first light transmissive material layer 71s, for example. A second solution in which a plurality of particles 77 are dispersed in a second light transmissive resin is used for the formation of the second light transmissive material layer 72s, for example. A third solution in which a plurality of particles 77 are dispersed in a third light transmissive resin is used for the formation of the third light transmissive material layer 73s, for example. The materials of the first to third light transmissive resins may be the same as one another, or may be different from one another.

The concentration of particles 77 (particle concentration) is different between the first to third solutions (the first to third light transmissive material layers 71s to 73s), for example. In this example, a second particle concentration of particles 77 in the second solution (the second light transmissive material layer 72s) is higher than a first particle concentration of particles 77 in the first solution (the first light transmissive material layer 71s). A third particle concentration of particles 77 in the third solution (the third light transmissive material layer 73s) is higher than the first particle concentration of particles 77 in the first solution and lower than the second particle concentration of particles 77 in the second solution.

The first to third solutions are applied onto the support body 6 and are processed for shaping by the screen printing method, potting, molding, compression molding, or the like, for example. At this time, the first solution is applied onto a first support body, for example. The second solution is applied onto a second support body. The third solution is applied onto a third support body. The first to third support bodies are different from one another, for example. Heating is performed for pre-curing (the first curing), and the first to third light transmissive material layers 71s to 73s are removed from the support body 6 (the first to third support bodies) and formed, for example.

Figure 6D:
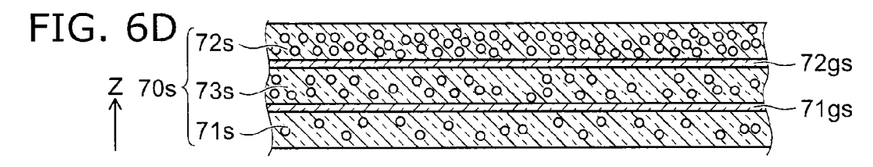

As shown in FIG. 6D, the first to third light transmissive material layers 71s to 73s are bonded together via bonding material layers. The third light transmissive material layer 73s is disposed between the first light transmissive material layer 71s and the second light transmissive material layer 72s. In this example, the first light transmissive material layer 71s and the third light transmissive material layer 73s are bonded together by a first bonding material layer 71gs. The second light transmissive material layer 72s and the third light transmissive material layer 73s are bonded together by a second bonding material layer 72gs. Thereby, the light transmissive material layer 70s is formed.

Figure 6E:
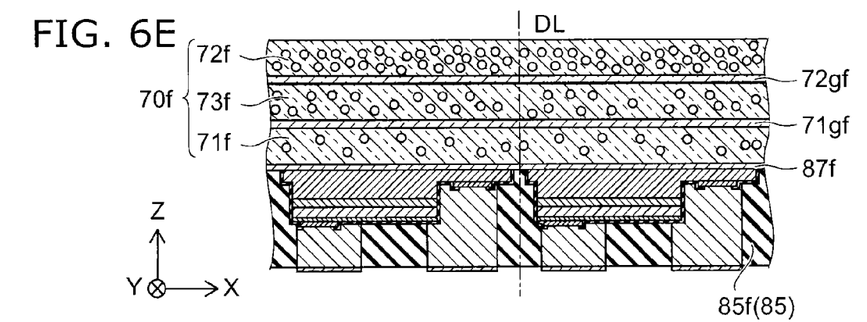

As shown in FIG. 6E, the light transmissive material layer 70s is disposed on the intermediate film 87f. At this time, the arrangement is made such that the second light transmissive material layer 72s (the layer with a high concentration of particles 77) is on the upper side (on the opposite side to the side opposing the intermediate film 87f). That is, the first light transmissive material layer 71s (and the third light transmissive material layer 73s) is disposed between the second light transmissive material layer 72s and the second semiconductor layer 20.

Heating is performed to cure the resin contained in the light transmissive material layer 70s (the second curing) to form the light transmissive film 70f. The first light transmissive material layer 71s forms a first light transmissive film 71f. The second light transmissive material layer 72s forms a second light transmissive film 72f. The third light transmissive material layer 73s forms a third light transmissive film 73f. The first bonding material layer 71gs forms a first bonding film 71gf. The second bonding material layer 72gs forms a second bonding film 72gf.

The light transmissive material layer 70s, the intermediate film 87f, and the sealing film 85f are cut along a dicing line DL, for example. Thereby, a semiconductor light emitting element 112 shown in FIG. 6F is formed.

Figure 6F:
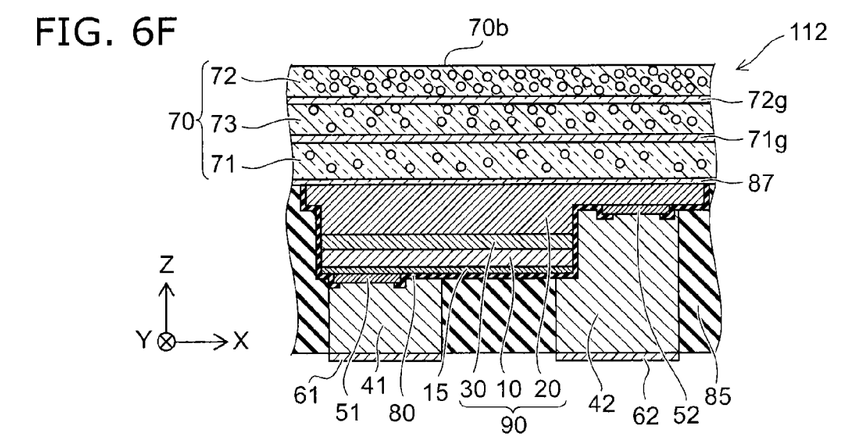

As shown in FIG. 6F, in the semiconductor light emitting element 112, the first light transmissive film 71f forms the first portion 71 of the light transmissive layer 70. The second light transmissive film 72f forms the second portion 72 of the light transmissive layer 70. The third light transmissive film 73f forms a third portion 73 of the light transmissive layer 70, for example. The first bonding film 71gf forms a first bonding layer 71g. The second bonding film 72gf forms a second bonding layer 72g. Also in the semiconductor light emitting element 112, the concentration of particles 77 in the second portion 72 is set higher than the concentration of particles 77 in the first portion 71 so that the hardness of the second portion 72 is higher than the hardness of the first portion 71. Also in the semiconductor light emitting element 112, high productivity is obtained in mounting, for example.

In this example, the third portion 73 in the light transmissive layer 70 is provided as necessary and may be omitted. That is, the third light transmissive material layer 73s and the second bonding material layer 72gs are provided as necessary and may be omitted. That is, the number of light transmissive material layers provided in the light transmissive layer 70 may be two, or may be three or more.

In the semiconductor light emitting element 112, the light transmissive layer 70 includes the first portion 71, the second portion 72, the third portion 73, the first bonding layer 71g, and the second bonding layer 72g, for example. A distribution may be provided in the refractive index in the light transmissive layer 70. The refractive index of the second portion 72 may be set lower than the refractive index of the first portion 71, for example. Thereby, the light extraction efficiency can be increased.

In the semiconductor light emitting element 112, a fluorescent particle is used as the particle 77, and a concentration distribution of particles 77 is formed. Thereby, a color shift is suppressed.

In this example, the density of particles 77 contained in the second portion 72 is set higher than the density of particles 77 contained in the first portion 71 so that the hardness of the second portion 72 of the light transmissive layer 70 is higher than the hardness of the first portion 71. The embodiment is not limited thereto, and it is also possible to vary the hardness by differentiating the resin material contained in the first portion 71 and the resin material contained in the second portion 72.

Figure 7A:
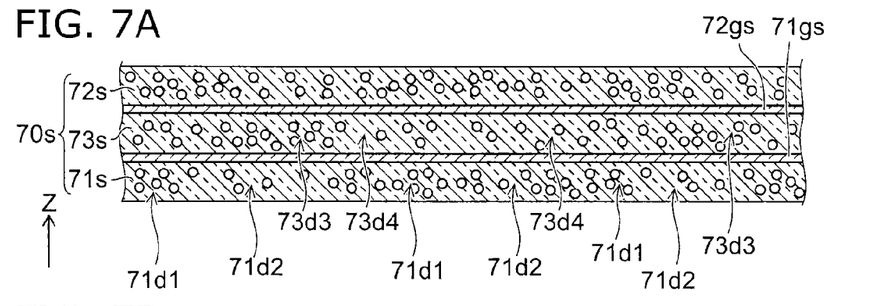
FIG. 7A to FIG. 7C are schematic cross-sectional views in order of the processes, illustrating a method for manufacturing a semiconductor light emitting element according to the first embodiment.
Figure 7B:
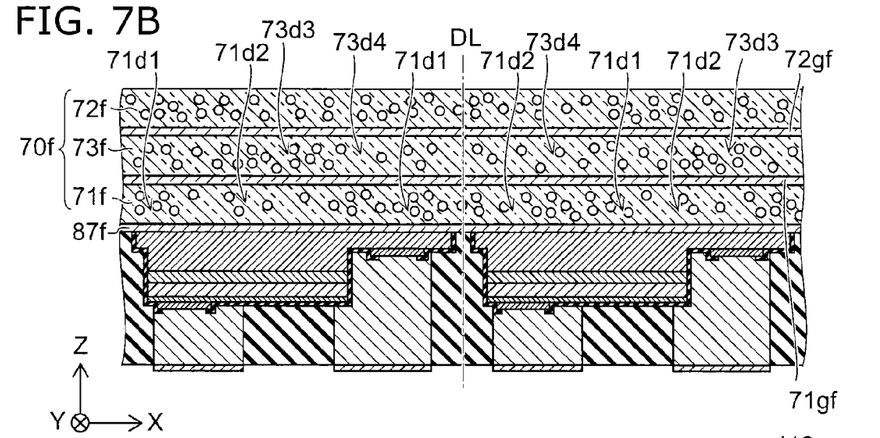
Figure 7C:
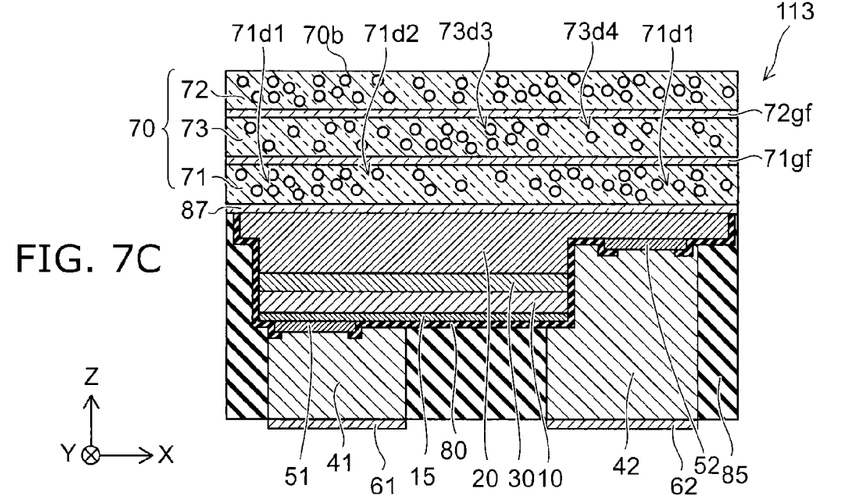

FIG. 7A to FIG. 7C are schematic cross-sectional views in order of the processes, illustrating a method for manufacturing a semiconductor light emitting element according to the first embodiment.

The drawings illustrate a method for manufacturing the light transmissive layer 70 of a semiconductor light emitting element 113.

As shown in FIG. 7A, the light transmissive material layer 70s includes the first light transmissive material layer 71s, the second light transmissive material layer 72s, and the third light transmissive material layer 73s. The first to third solutions described above are applied onto the support body 6 (the first to third support bodies) and are processed for shaping by the screen printing method, potting, molding, compression molding, or the like to form a coating film (the first to third light transmissive material layers 71s to 73s), for example. The coating film is pre-cured to peel off the coating film (the first to third light transmissive material layers 71s to 73s) from the support body 6 (the first to third support bodies), respectively), for example. The first light transmissive material layer 71s and the third light transmissive material layer 73s are bonded together by the first bonding material layer 71gs, for example. The second light transmissive material layer 72s and the third light transmissive material layer 73s are bonded together by the second bonding material layer 72gs. Thereby, the light transmissive material layer 70s is formed. The third light transmissive material layer 73s is disposed between the second light transmissive material layer 72s and the first light transmissive material layer 71s.

In this example, the distribution of particles 77 is non-uniform in each of the first light transmissive material layer 71s and the third light transmissive material layer 73s.

The first light transmissive material layer 71s includes a first concentration portion 71d1 and a second concentration portion 71d2, for example. The concentration of particles 77 in the first concentration portion 71d1 (a first concentration) is higher than the concentration of particles 77 in the second concentration portion 71d2 (a second concentration). The first concentration portion 71d1 and the second concentration portion 71d2 are juxtaposed when projected onto a plane perpendicular to the stacking direction.

The third light transmissive material layer 73s includes a third concentration portion 73d3 and a fourth concentration portion 73d4, for example. The concentration of particles 77 in the third concentration portion 73d3 (a third concentration) is higher than the concentration of particles 77 in the fourth concentration portion 73d4 (a fourth concentration). The third concentration portion 73d3 and the fourth concentration portion 73d4 are juxtaposed when projected onto a plane perpendicular to the stacking direction.

In this example, particles are distributed almost uniformly in the second light transmissive material layer 72s. In this example, the concentration of particles 77 in the second light transmissive material layer 72s is higher than the average concentration of particles 77 in the first light transmissive material layer 71s. The concentration of particles 77 in the second light transmissive material layer 72s is higher than the average concentration of particles 77 in the third light transmissive material layer 73s.

The first to third light transmissive material layers 71s to 73s thus configured are stacked on one another. At this time, as shown in FIG. 7A, the stacking is made such that the first concentration portion 71d1 and the fourth concentration portion 73d4 overlap when projected onto a plane perpendicular to the stacking direction. The stacking is made such that the second concentration portion 71d2 and the third concentration portion 73d3 overlap, for example. Thereby, the in-plane variation in the concentration of particles 77 can be suppressed.

As shown in FIG. 7B, the light transmissive material layer 70s is disposed on the intermediate film 87f. At this time, the first light transmissive material layer 71s (and the third light transmissive material layer 73s) is disposed between the second light transmissive material layer 72s and the second semiconductor layer 20.

Heating is performed to cure the resin contained in the light transmissive material layer 70s to form the light transmissive film 70f. The first to third light transmissive material layers 71s form the first to third light transmissive films 71f, respectively. The first and second bonding material layers 72gs form the first and second bonding films 72gf, respectively.

The light transmissive material layer 70s, the intermediate film 87f, and the sealing film 85f are cut along a dicing line DL, for example. Thereby, a semiconductor light emitting element 113 shown in FIG. 7C is formed.

The first light transmissive film 71f forms at least part of the first portion 71 of the light transmissive layer 70, for example. The second light transmissive film 72f forms at least part of the second portion 72 of the light transmissive layer 70, for example. The third light transmissive film 73f forms at least part of the third portion 73 of the light transmissive layer 70, for example.

In the semiconductor light emitting element 113, the second portion 72 has a high concentration of particles 77, and therefore has a high hardness. The productivity in molding is high also in the semiconductor light emitting element 113.

In the semiconductor light emitting element 113, the in-plane variation in the concentration of particles 77 in the light transmissive layer 70 is reduced. Furthermore, a color shift in the light emitted from the semiconductor light emitting element 113 is suppressed.

In this example, even when a variation occurs in the concentration of particles 77 in a light transmissive material layer, light transmissive material layers may be stacked so that the concentration variation is corrected; thereby, the variation in concentration is reduced. Thus, the productivity in the manufacturing of semiconductor light emitting elements is improved.

The embodiment provides a semiconductor light emitting element of high mounting productivity and a method for manufacturing the same.

In the specification, "nitride semiconductor" includes all semiconductors expressed by the chemical formula of $B_xIn_yAl_zGa_{1-x-y-z}N$ ($0 \leq x \leq 1$, $0 \leq y \leq 1$, $0 \leq z \leq 1$, $x+y+z \leq 1$) in which the composition ratios x, y, and z are changed in the respective ranges. Furthermore, also those further containing a group V element other than N (nitrogen), those further containing various elements added in order to control various properties such as the conductivity type, and those further containing various elements unintentionally contained in the chemical formula mentioned above are included in the "nitride semiconductor."

Hereinabove, embodiments of the invention are described with reference to specific examples. However, the embodiment of the invention is not limited to these specific examples. For example, one skilled in the art may appropriately select specific configurations of components of semiconductor light emitting elements such as first semiconductor layers, light emitting layers, second semiconductor layers, first electrodes, second electrodes, first conductive pillars, second conductive pillars, sealing units, light transmissive layers, light transmissive units, particles, intermediate layers, insulating layers, and reflection layers from known art and similarly practice the invention. Such practice is included in the scope of the invention to the extent that similar effects thereto are obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element comprising:
a first conductive pillar extending in a first direction;
a second conductive pillar provided apart from the first conductive pillar in a second direction crossing the first direction and extending in the first direction;
a first semiconductor layer of a first conductivity type provided on the first conductive pillar;
a light emitting layer provided on the first semiconductor layer;
a second semiconductor layer of a second conductivity type provided on the light emitting layer and on the second conductive pillar;
a sealing unit covering a side surface of the first conductive pillar and a side surface of the second conductive pillar; and
a light transmissive layer provided on the second semiconductor layer and having light transmissivity, the light transmissive layer including a first light transmissive material layer and a third light transmissive material layer,
the first light transmissive material layer including:
a first concentration portion containing a plurality of particles at a first concentration; and
a second concentration portion aligned with the first concentration portion in a direction crossing a stacking direction from the first film toward the second film and containing a plurality of particles at a second concentration higher than the first concentration,
the third light transmissive material layer including:
a third concentration portion containing a plurality of particles at a third concentration; and
a fourth concentration portion aligned with the third concentration portion in the direction crossing the stacking direction and containing a plurality of particles at a fourth concentration higher than the third concentration, and
at least part of the first concentration portion overlapping at least part of the fourth concentration portion and at least part of the second concentration portion overlapping at least part of the third concentration portion when projected onto a plane perpendicular to the stacking direction.

2. The semiconductor light emitting element according to claim 1, wherein a thickness of the light transmissive layer is not less than 10 µm and not more than 300 µm.

3. The semiconductor light emitting element according to claim 1, wherein the light transmissive layer absorbs at least part of a first light emitted from the light emitting layer and emits a second light having a peak wavelength different from a peak wavelength of the first light.

4. The semiconductor light emitting element according to claim 1, wherein
the light transmissive layer contains a plurality of particles and a light transmissive resin in which the plurality of particles are dispersed.

5. The semiconductor light emitting element according to claim 4, wherein the light transmissive resin contains at least one of a silicone resin and methyl phenyl silicone.

6. The semiconductor light emitting element according to claim 3, wherein an average particle size of the plurality of particles is not less than 1 µm and not more than 50 µm.

7. The semiconductor light emitting element according to claim 4, wherein
the light transmissive layer absorbs at least part of a first light emitted from the light emitting layer and emits a second light having a peak wavelength different from a peak wavelength of the first light,
the first light is blue light and the second light is yellow light, and
the plurality of particles includes a fluorescent particle configured to convert the first light to the second light.

8. The semiconductor light emitting element according to claim 4, wherein the particle includes a filler.

9. The semiconductor light emitting element according to claim 1, wherein
the light transmissive layer further includes a second light transmissive material layer in which a plurality of particles are dispersed at a second particle concentration higher than the first particle concentration, the third light transmissive material layer being provided between the first light transmissive material layer and the second light transmissive material layer, and
the first light transmissive material layer is disposed between the second light transmissive material layer and the second semiconductor layer.

10. The semiconductor light emitting element according to claim 1, further comprising an intermediate layer provided between the second semiconductor layer and the light transmissive layer and having light transmissivity.

11. The semiconductor light emitting element according to claim 10, wherein a refractive index of the intermediate layer is higher than a refractive index of the light transmissive layer.

12. The semiconductor light emitting element according to claim 10, wherein the intermediate layer contains at least one of silicon oxide and silicon nitride.

13. The semiconductor light emitting element according to claim 1, further comprising an insulating layer provided at least one of between part of the first semiconductor layer and part of the sealing unit, between part of the light emitting layer and part of the sealing unit, and between part of the second semiconductor layer and part of the sealing unit.

14. The semiconductor light emitting element according to claim 1, wherein a hardness of an upper surface portion of the light transmissive layer is higher than a hardness of a lower portion between the upper surface portion and the second semiconductor layer.

* * * * *